United States Patent
Wu

(10) Patent No.: US 10,656,182 B2
(45) Date of Patent: May 19, 2020

(54) METHOD AND DEVICE FOR ACCESSING DATA ACQUIRED BY DIGITAL OSCILLOSCOPE, AND DIGITAL OSCILLOSCOPE

(71) Applicant: GAOEE Technology INC, Shenzhen (CN)

(72) Inventor: Yan Wu, Shenzhen (CN)

(73) Assignee: GAOEE TECHNOLOGY INC, Shenzhen (CN)

(*) Notice: Subject to any disclaimer, the term of this patent is extended or adjusted under 35 U.S.C. 154(b) by 413 days.

(21) Appl. No.: 15/624,710

(22) Filed: Jun. 16, 2017

(65) Prior Publication Data

US 2017/0285072 A1    Oct. 5, 2017

Related U.S. Application Data

(63) Continuation of application No. PCT/CN2015/095876, filed on Nov. 28, 2015.

(30) Foreign Application Priority Data

Dec. 31, 2014 (CN) .......................... 2014 1 0845998

(51) Int. Cl.
*G01R 13/02* (2006.01)
*G01R 13/16* (2006.01)

(52) U.S. Cl.
CPC .......... *G01R 13/02* (2013.01); *G01R 13/029* (2013.01); *G01R 13/0272* (2013.01); *G01R 13/16* (2013.01)

(58) Field of Classification Search
None
See application file for complete search history.

(56) References Cited

U.S. PATENT DOCUMENTS 5,283,596 A    2/1994 Long
5,530,454 A    6/1996 Etheridge et al.
(Continued)

FOREIGN PATENT DOCUMENTS

CN    101275973 A    10/2008
CN    102539865 A    7/2012
(Continued)

OTHER PUBLICATIONS

Jing, Hao et. al.,Portable DSO Based on TFT Colorized LCD, Modern Electronic Technique, No. 18, Sep. 15, 2010, ISSN:1004-373X, pp. 166-169.

*Primary Examiner* — Aditya S Bhat

(57) ABSTRACT

A method for accessing data acquired by a digital oscilloscope, consists of the following steps: sampling signals based on a preset sampling frequency and converting into binary data by an ADC, continuously storing the data into a buffer based on preset rules; simultaneously, generating one trigger event based on preset timebase parameters and trigger conditions each time when acquired data meets the, trigger, conditions; reading a data segment from the buffer corresponding to the trigger event, and forming a waveform and then displaying. The procedure of storing, the acquired data into the buffer is independent of the procedure of generating the trigger event or reading the data segment or displaying the waveform. The implementation of the method and device for accessing data acquired by a digital oscilloscope as well as the digital oscilloscope brings the following advantages: seamless acquisition is achieved, the sampling rate is not restricted by timebase parameters, and the memory depth is not restricted by the waveform processing speed as traditional oscilloscope.

20 Claims, 3 Drawing Sheets

(56) References Cited

U.S. PATENT DOCUMENTS

| | | | | |
|---|---|---|---|---|
| 5,877,621 A * | 3/1999 | Beyers | ............... | G01R 13/345 324/121 R |
| 5,986,637 A | 11/1999 | Etheridge et al. | | |
| 6,195,617 B1 * | 2/2001 | Miller | ............... | G01R 13/345 345/440 |
| 7,529,641 B2 * | 5/2009 | Sullivan | ............ | G01R 31/3167 702/176 |

FOREIGN PATENT DOCUMENTS

| | | | |
|---|---|---|---|
| CN | 103353543 | A | 10/2013 |
| CN | 103558434 | A | 2/2014 |
| EP | 0677746 | B1 | 9/2008 |

\* cited by examiner

METHOD AND DEVICE FOR ACCESSING DATA ACQUIRED BY DIGITAL OSCILLOSCOPE, AND DIGITAL OSCILLOSCOPE

CROSS-REFERENCE TO RELATED APPLICATIONS

This application is a continuation of International Patent Application No. PCT/CN2015/095876 with a filing date of Nov. 28, 2015, designating the United States, now pending, and further claims priority to Chinese Patent. Application 201410845998.5 with a filing date of Dec. 31, 2014. The content of the aforementioned application, including any intervening amendments thereto, are incorporated herein by reference.

TECHNICAL FIELD

The present invention relates to the field of measuring instruments, specifically to a method and device for accessing data acquired by a digital oscilloscope, and a digital oscilloscope.

BACKGROUND OF THE PRESENT INVENTION

Modern digital oscilloscopes all include a data acquisition storage module, which is controlled by triggers and timebase. In general, the control principle is as follows: the ADC (analog-to-digital converter) and acquisition memory start to work when the oscilloscope is in data acquiring mode, the voltage signals from oscilloscope probes are converted into binary data by the ADC, and then the data is stored into the acquisition memory; the sampling frequency of the ADC is determined by timebase and depth of the acquisition memory; the oscilloscope determines when to start and when to stop saving the acquired data base on trigger time and timebase; when the acquisition memory stops the savage, the data saved in the storage is the data to be processed by the oscilloscope; then the data processor reads the data from the acquisition memory and processes the data; after all the data in the acquisition memory is read out, the acquisition memory begins a next data savage and repeats this cycle again and again.

The operation mode of traditional data acquisition memory can be single segmental storage or multi-segmental storage. In single segmental storage mode, the data acquiring module acquires data continually, and the procedure of writing data into acquisition memory is control by the trigger signal generating timing and the timebase setting; the data read-out module reads the data out from the acquisition memory and provides it to the subsequent data processing module to process. During the data read-out procedure, the data cannot be written into acquisition memory. Accordingly, the oscilloscope will have a "dead-time", during the "dead-time" period, the oscilloscope cannot record any data acquired.

In multi-segmental storage mode, a relatively larger buffer is divided into multiple small acquisition memories, each small acquisition memory records one segment of waveform data Each small acquisition memory work similar to single segmental storage memory, but in multi segmental storage mode, the acquisition memories can operate alternately, namely when one acquisition memory stops writing data, the data can be wrote into another acquisition memory. This multi-segmental storage mode can reduce dead-time effectively, however it fails to achieve seamless acquisition. Because each acquisition memory can only record one data segment, the beginning and ending of one data segment is actually controlled by trigger signals, if the time intervals between the trigger signals equal to storage time of acquisition memories, the data is just seamlessly stored in adjacent acquisition memories, however, in real situation, the time intervals between the trigger signals are uncertain, accordingly, adjacent waveform segments are not seamlessly continuous.

Additionally, in prior art, in the single segmental storage mode or multi-segmental storage mode, since each trigger event corresponds to one segment of acquisition memory, for a given sampling frequency, the shorter the trigger interval is, the shorter the acquisition memory is, that is, the shallower the memory depth is, therefore, the higher the capture rate is, the shorter the data segment is. The capture rate and the memory depth are mutual-restrained, and hence it cannot achieve the maxis rapture rate and the maximum memory depth simultaneously.

SUMMARY OF PRESENT INVENTION

To solve the technical problems in the, prior art that it cannot achieve seamless acquisition, the sampling rate is restricted by timebase parameters, and it cannot achieve both maximum capture rate and maximum memory depth simultaneously, the present invention provides a method of accessing data for a digital oscilloscope, as well as a device and a digital oscilloscope which can achieve seamless acquisition, sampling rate unrestricted, and achieve maximum capture rate and maximum memory depth simultaneously.

The technical solutions of the present invention solving the technical problems are: providing a method for accessing data acquired by a digital oscilloscope and the method consists of the following steps:

sampling signals based on a preset sampling frequency and converting into binary data by an ADC, and continuously storing the data into a buffer based on preset rules;

generating, one trigger, event based on preset timebase parameters and trigger conditions each time when acquired data meets the trigger conditions; and reading a data segment from the buffer corresponding to the trigger event, and forming a waveform and then displaying;

wherein the procedure of storing the acquired data into the buffer is independent of the procedure of generating the trigger event or reading the data segment, or displaying the waveform.

Further, when reading the data segment, address information of the data segment in the buffer is directly obtained or obtained after calculation, by using the address information or time stamp information in the trigger event, so that the data segment can be accurately read from the buffer.

Further, during the procedure of acquiring data, continuously writing acquired data into the buffer based on the preset rules, simultaneously with reading and displaying the data segment: the data read is the data written into a location during current data coverage; the buffer is reusable, after the data is written into the last location of the buffer, returning to the first location, current data is written into the buffer to overwrite existing data that previously written; existing data in the buffer is continuously and periodically overwritten by current data; a writing pointer to the buffer moves based on the preset rules, and points to a location of the buffer where the data is not overwritten during current data writing.

Further, in the step of storing the data into the buffer, the data is written into the buffer cycled; a write-in cycle T of the buffer equals total buffer capacity divided by data write-in speed; a data-delay-time t for data segment existing in the buffer starts from the moment that the data segment is written in, and ends at the moment that the data segment is read out; the depth of the buffer ensure T greater than t, namely the write-in cycle of the buffer is greater than the data-delay-time of the data segment corresponding to the trigger event.

Further, arranging a plurality of trigger events together to form a trigger-event-list; reading the data segment corresponding to each trigger event from the buffer and displaying, simultaneously with acquiring data; or if the operating mode of acquisition is stopped, reading corresponding data segment from the buffer and displaying based on each trigger event in the trigger-event-list.

Further, in the case that the data acquisition is stopped and the trigger conditions are changed, scanning the data in the buffer based on the changed trigger conditions and generating new trigger events and forming a new trigger-event-list, reading corresponding data based on the new trigger events in the new trigger-event-list and displaying corresponding waveforms.

Further, one of the preset rules is that the writing point starts from one end of the buffer, and points to a next storage location by plus one or minus one after every data wrote.

The present invention includes a device to achieve above method, comprising:

a data acquiring module, used to sample signals based on a preset sampling frequency and convert into binary data by an ADC, and continuously store the data into a buffer based on preset rules;

a trigger event generating module, used to work the data acquiring module and generate one trigger event based on preset timebase parameters and trigger conditions when acquired data meets the trigger conditions; and a data read-out module, used to read one data segment from the buffer corresponding to one trigger event, and form a waveform and display;

wherein the procedure of storing the acquired data into the buffer is independent of the procedure of generating the trigger event or reading the data segment or displaying the waveform.

Further, the trigger event contains address information or time stamp information of the data segment corresponding to the trigger event, so that the data read-out module is able to locate the location of the data segment. The trigger event generating module, contains a trigger-event-list forming module which is used to arrange a plurality of trigger events together to form a trigger-event-list. The data read-out module is used to read the data segment corresponding to each trigger event in the trigger-event-list from the buffer and display, or in the operating mode of acquisition is stopped, the data read-out module is used to read the data segment corresponding to each trigger event in the trigger-event-list from the buffer and display.

The present invention includes a digital oscilloscope for converting a measured signal into a digital signal and displaying, and the digital oscilloscope stores, accesses and displays data with any one of above mentioned methods.

The implementation of the method and device for accessing data acquired by a digital oscilloscope as well as the digital oscilloscope brings the following advantages: since the trigger signal do not control data acquire and data storage, it just used to generate trigger event only, because the data storage is independent of trigger event, data storage never stops during data is read out from buffer, hence there is no "dead-time" which exists in the prior art. So, the seamless acquisition can be achieved and sampling rate is not restricted.

DETAILED DESCRIPTION OF PREFERRED EMBODIMENTS

The embodiments of the, present invention will be further illustrated with the accompanying drawings.

Figure 1:
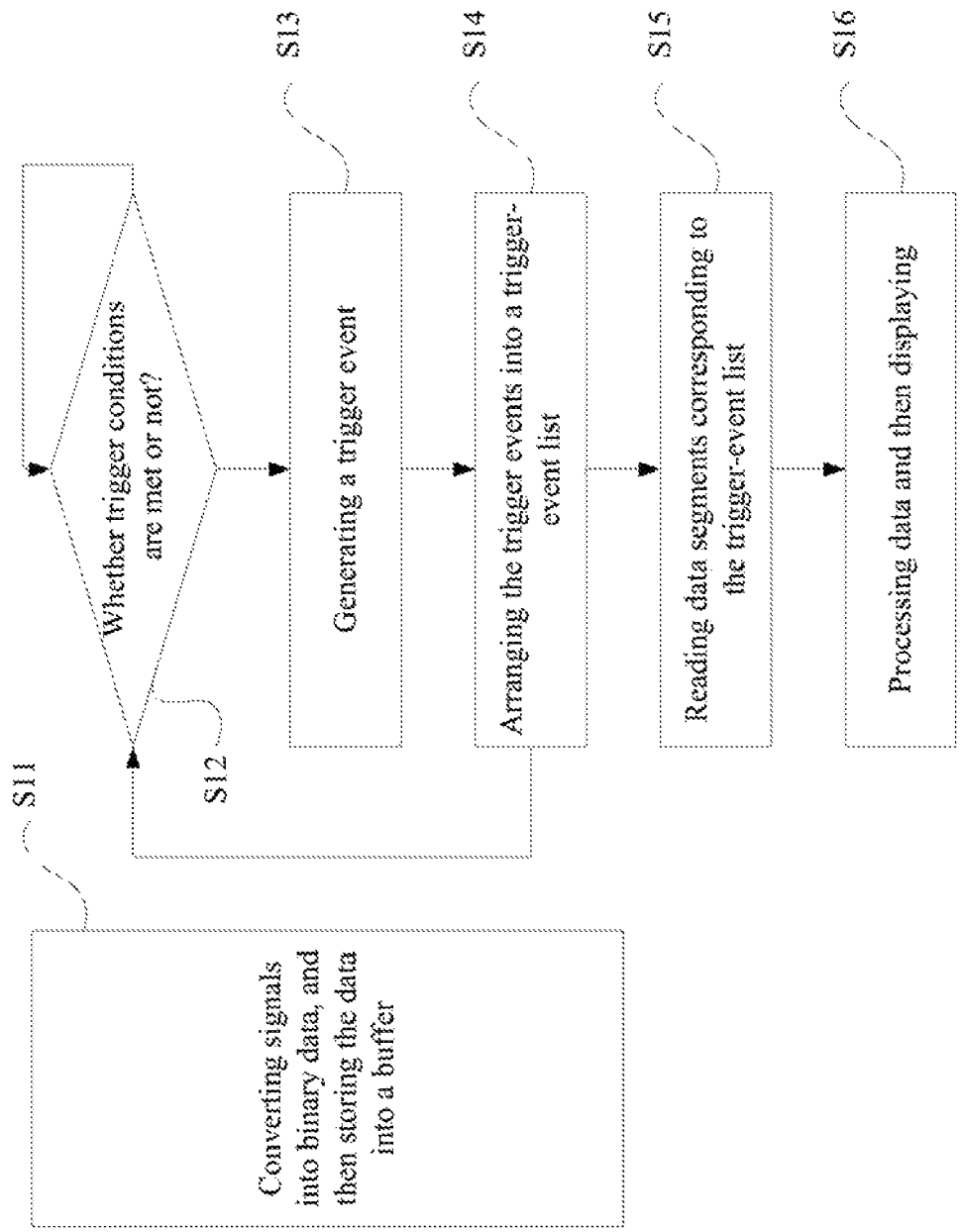
FIG. 1 is a flowchart of a method for accessing data acquired by a digital oscilloscope according to an embodiment of the present invention.
Figure 3:
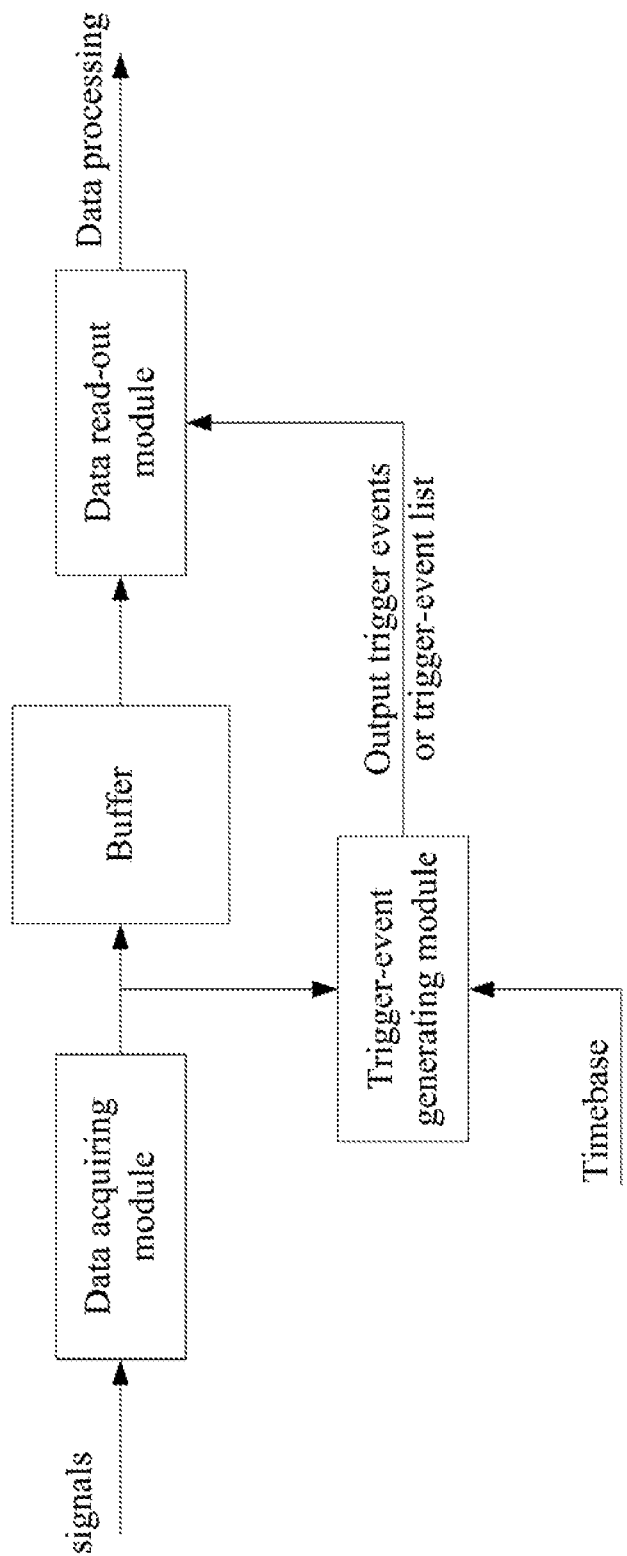
FIG. 3 is structural diagram of a device for accessing data acquired by a digital oscilloscope according to an embodiment of the present invention.

Referring to FIGS. 1 and 3, in the embodiment of the method and device for accessing data acquired by a digital oscilloscope as well as a digital oscilloscope as shown in FIG. 3, the device contains a data acquiring module, a trigger event generating module, a data read-out module and a buffer for storing data.

The operating principle of the data acquiring module is shown in step S11 of FIG. 1. The data acquiring module converts analog signals into binary data based on a preset sampling frequency and stores the data into the buffer based on preset rules. In this embodiment, the procedure that the oscilloscope converts analog signals into binary data is not essentially different from that of the prior art; however the data acquiring module has two key points that is different from the prior art:

The first point is that the sampling frequency is not restricted by timebase. In the prior art, the sampling frequency is as high as nominal frequency under fast timebase; however when in slow timebase, for example below 10 ms/div, the actual sampling frequency must be stow down otherwise the data will overflow buffer capacity. In the present embodiment the sampling frequency can keep the same in full scale of the timebase.

The second point is that the operation of writing into the buffer is neither restricted by timebase nor by trigger signals. In the present embodiment, in the procedure of writing into the buffer, the acquired data is written into the whole buffer circularly sequentially. When the data is written into the ending location of the buffer, it returns to the beginning location of the buffer and continues writing, and overwrites previously write-in data. New data (i.e. current data or currently write-in data) continually and periodically overwrites the old data in the buffer (i.e. data existing in the location of the buffer prior to current writing procedure). In this way, the data update cycle equals to data-hold-time in the buffer. The data read-out module can read data at any time before the data, is renewed.

The operating principle of the trigger event generating module is shown in steps S12-S14 of FIG. 1.

Step S12 starts synchronously with step S11. Step S12 checks if the data from the acquiring module meets trigger conditions or not. If yes, the next step is executed; otherwise repeat current step.

Step S13 reads the address of the trigger point data, and generates a trigger event. In the present embodiment, the trigger event generating module contains an address counter which synchronizes with the buffer address. When the acquired data meets the trigger conditions, read the address counter to get the buffer address of the trigger event data. Then, count up trigger delay and timebase setting, to calculate the beginning address and the ending address of the data segment corresponding to the trigger event.

The beginning address and the ending address of the data segment corresponding to the trigger event can be calculated by the trigger event generating module and placed in the trigger-event-list. Alternately, the beginning address and the ending address can be calculated by the data read-out module, and the trigger event may only include the address information of the trigger point, this way can reduce the memory size of the trigger-event-list.

The trigger events generated in step S13 are arranged together n step S14 to form a trigger-event-list. The forming of the trigger-event-list is meaningful because the subsequent data processing module does not always immediately process the event when each trigger event is generated (namely the event cannot be processed in real time). Therefore, arranging the trigger events together to form the trigger-event-list enables the data read-out module and the subsequent data processing module to process each trigger event in the trigger-event-list with the best efficiency based on their own working pace.

The data read-out module executes step S15. In this step, the data segment corresponding to each trigger event in the trigger-event-list is read out in preset sequence based on the trigger-event-list provided by the trigger event generating module, and is provided to the subsequent data processing module to process.

In the present embodiment, the trigger-event-list only records the location of the trigger point of each trigger event, and the data read-out module calculates the beginning location and ending location of the data segment corresponding to the trigger event based on time delay of the trigger point and the timebase setting, and then the data segment can be obtained accurately.

If the trigger event includes the beginning location and ending location of the data segment of the trigger event, there is no need to calculate the address in this step.

The data is processed by the subsequent data processing module in step S16.

Notably, in the present embodiment, the step S11 is independent of the subsequent steps. That is to say, no matter how the subsequent steps are, executed, the step S11 will be always periodically executed based on above rules unless it is stopped or the data acquire is restarted, for example, the operator presses a stop button or changes the timebase parameters.

In the present embodiment, the advantage of above trigger-event-list is that the time of reading data segment is independent of the time when the trigger event happens. Namely, the data segment in the buffer corresponding to one trigger event can be read out at any time as long as it is not overwritten by newly acquired data.

What needs to be emphasized is that the generating of the trigger event, and the reading of the data and displaying are independent of the step of storing the acquired data into the buffer (i.e. step S11) in the present embodiment. That is to say, in the present embodiment, simultaneously with reading the data and displaying, acquired data is continuously written into the buffer based on preset rules, which enables the buffer always keep the data for a period of time, this period of time equals to the data write in cycle of the buffer. During, the writing procedure, a writing pointer to the buffer continuously moves based on the preset rules and points to a location of data which has hold longest time in the buffer. In the present embodiment, the data read out in above procedure is the data written into the storage location during current write-in cycle (i.e. was wrote in last cycle mention above), but not previous writing cycle, for one location, if the previous data is yet to overwritten in current write cycle, the reading pointer will not point to it yet.

Figure 2:
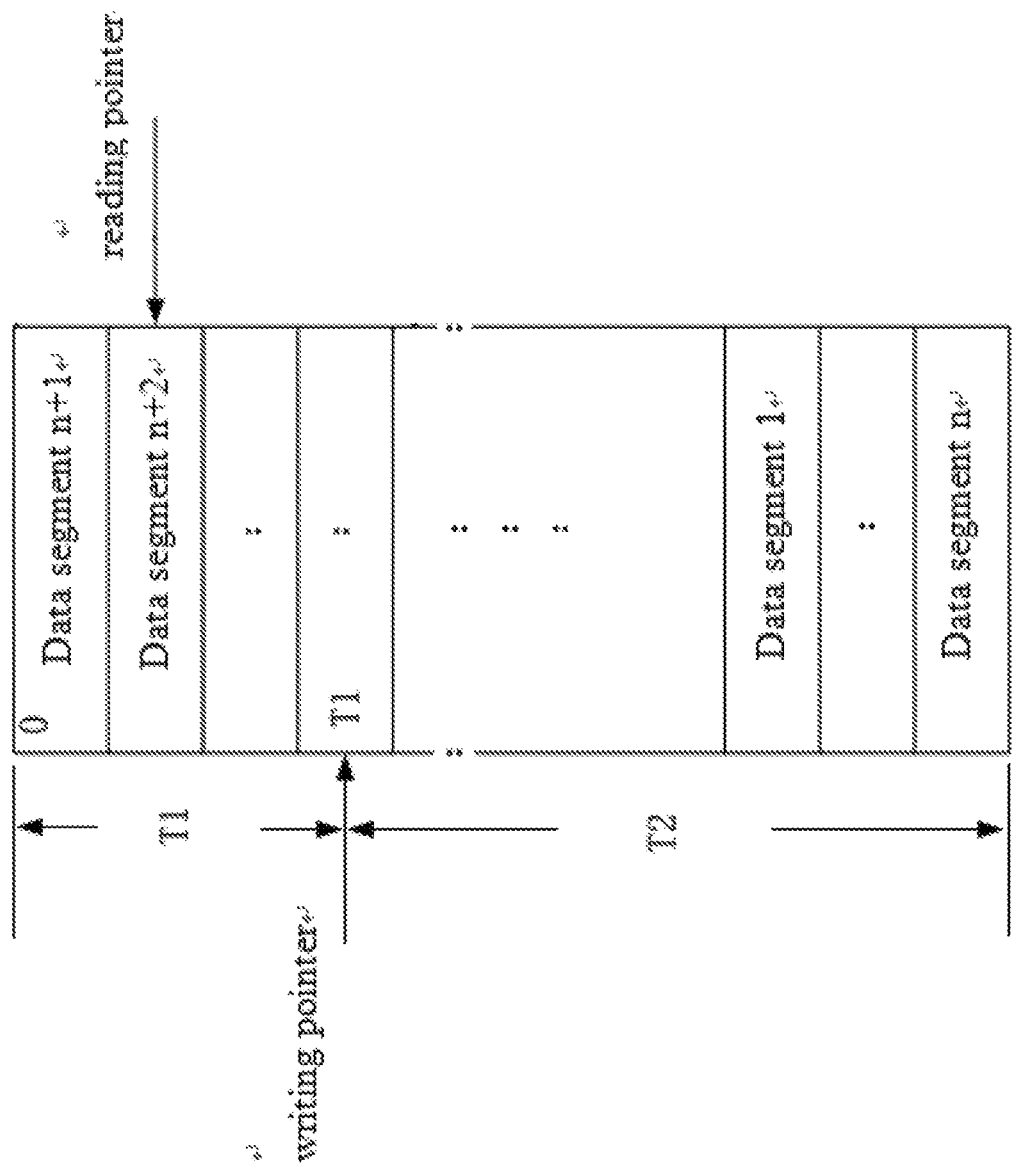
FIG. 2 is diagram showing a state of a buffer when reading data at a certain moment according to the embodiment of the present invention.

FIG. 2 is a structure diagram showing the locations of a writing pointer, a reading pointer and the buffer at a certain instant when the buffer is both reading and writing. In FIG. 2, the writing pointer starts from the top of the buffer and moves to bottom, data is written into the buffer from, top to bottom.

In FIG. 2, when data is written into the buffer, address starts from the top side. The duration the writing pointer moves from the top to current location is T1, the duration the writing pointer moves from current location to the bottom of the buffer will be T2. Accordingly, a write in cycle of whole buffer is T=T1+T2.

Divided by the writing pointer, the data just under the writing pointer keep in the buffer for the longest time and is to be renew in coming write in operation, the data just above the writing pointer is last written in and will be renew after the write-in cycle T.

Referring to FIG. 3, the present embodiment further illustrates a device to achieve above method. FIG. 3 shows the general structure of the device. The device contains: a data acquiring module, a trigger event generating module, a data read-out module and a buffer for storing the data. The data acquiring module is used to sample signals based on a preset sampling frequency and convert into binary data by an ADC, and continuously store the data into the buffer based on preset rules. The trigger event generating module works with the data acquiring module and generating one trigger event based on preset timebase parameters and trigger conditions each time when acquired data meets the trigger conditions. The data read-out module is used to read data segments from the buffer corresponding to the trigger events, and form waveforms for data segments and display. The procedure of storing the acquired data into the buffer is independent of the procedure of generating the trigger event or reading the data segment or displaying the waveform.

In the present embodiment, the trigger event contains address information or time stamp information of the data segment corresponding to the trigger event, so that the data read-out module can (or is able to) locate the location of the data segment corresponding to the trigger event. The trigger event generating module contains a trigger-event-list forming module (not shown in the drawings) used to arrange a plurality of trigger events together to form a trigger-event-list. The data read-out module is used to read the data segment corresponding to each trigger event in the trigger-event-list from the buffer and display; or if the operating mode of acquisition is stopped, the data read-out module is used to read the data segment corresponding to each trigger event in the trigger-event-list from the buffer and display.

In the present embodiment, in general, the oscilloscope includes a large capacity memory. The ADC can always work at the maximum or a specified sampling rate when it is in real-time acquisition mode. The data acquiring module continually store the data received from the ADC into the buffer, it send the ADC data to the trigger event generating, module simultaneously. Based on preset trigger conditions and timebase, the trigger event generating module continually monitors the data received from the data acquiring module generate trigger events and records them, to forms a trigger-event-list. The data read-out module extracts corresponding waveform data segment based on current timebase, current trigger delay and address information provided by the trigger-event-list, and pass the data to data processors. Each trigger event in the trigger-event-list corresponds to one waveform. In the present embodiment, above buffer may be single-port storages, such as DDR/DDR2/DDR3 or something like that, it may also be dual-port storages, such as QDR or something like that. When using the single-port storage, the port is time-shared by the write-in and read-out procedure. In timing view, the write-in procedure is not continuous, neither the read-out procedure. However, in terms of data integrity, the write-in data itself is sequential without missing, and the read-out data itself is also sequential without missing, therefore the write in and read out are regard as continually.

Additionally, the oscilloscope can also work in data analyzing mode. In data analyzing mode, the oscilloscope stops acquiring and recording new data, in this case, user can review and analyze the acquired data records. In data analyzing mode, user can change settings, such as adjust the timebase, or choose to view the waveforms within a certain period, and so on. In this case, the trigger event generating module generates new trigger-event-list based on new setting of the timebase and trigger conditions. The data read-out module extracts corresponding waveform data based on new trigger-event-list and other setting, and redraw new waveform on the display screen.

Generally speaking, in the present embodiment, in most timebase, far more than one segment of waveform data can be recorded since the record depth of the buffer is much larger than one segment of waveform. The data write in cycle of the buffer depends on buffer depth and sampling rate, nothing relates to trigger signal. The data stored in the buffer will be always keep entirely as long as the data last time not exceed the data write in cycle, no matter how many segments the data has been divided into, and no matter how long the time interval between two segments of waveform is. The subsequent data read out module should read data within the data write in cycle time. Oscilloscope can achieve seamless sampling and display waveforms without deadtime as long as the read-out module and displaying module can process fast enough.

In prior art, in single segmental storage or multi-segmental storage mode, since each trigger event corresponds to one segment of buffer, for a given sampling frequency, the shorter the trigger interval the shorter the corresponding buffer is, that is, the shallower the memory depth is. Therefore, the higher the capture rate is, the shorter data segment is. The capture rate and the memory depth are mutual-restraint.

However, in the present embodiment, a plurality segment of waveforms can be stored in the buffer since the write-in procedure of the buffer is independent of the trigger procedure or reading procedure. The waveform capture rate is determined by the interval of trigger events and processing speed of the subsequent read-out module and displaying module, and is independent of the capacity of the buffer. Therefore, the memory depth and the capture rate are not restrained to each other. The present invention proposes theoretically how the oscilloscope achieves both maximum capture rate and maximum memory depth simultaneously, which is an essential innovation and breakthrough in oscilloscope architecture.

Above mentioned embodiments only describe some implementations of the present invention, and the description is relatively, specific and detailed, however it cannot be explained as limitations to the protection scope of the present invention. It should be noted that those with ordinary skills in the art can also make many variations and modifications under the teaching of the present invention. All these variations and modifications belong to the protection scope of the present application. Therefore, the protection scope of the present invention is claimed in the following claims.

I claim:

1. A method for accessing data acquired by a digital oscilloscope, comprising the following steps:
    sampling signals based on a preset sampling frequency and converting the signals into binary data by an ADC, and continuously storing the data into a buffer based on preset rules;
    generating one trigger event based on preset timebase parameters and trigger conditions each time when acquired data meets the trigger conditions: and
    reading a data segment from the buffer corresponding to each trigger event, and forming a waveform and then displaying;
    wherein the procedure of storing the acquired data into the buffer is independent of the procedure of generating the trigger event or reading the data segment or displaying the waveform; the step of converting the signals into the binary data by the ADC, and continuously storing the data into the buffer can be always periodically executed based on the preset rules unless it is stopped or the data acquire is restarted; and the preset sampling frequency is not restricted by the timebase and can keep the same in full scale of the timebase.

2. The method for accessing data acquired by a digital oscilloscope according to claim 1, wherein, when reading the data segment, address information of the data segment in the buffer corresponding to the trigger event is directly obtained or obtained after calculation, by using the address information or time stamp information in the trigger event, so that the data segment corresponding to the trigger event is accurately read from the buffer.

3. The method for accessing data acquired by a digital oscilloscope according to claim 1, wherein, during the procedure of acquiring data, continuously writing last acquired data into the buffer based on the preset rules with simultaneously reading the data segment and displaying; the read-out data is that written into a location during current data coverage; the buffer is reusable, and when the last location of the buffer is written into, returning to a first location of the buffer; last data is written into the buffer to overwrite existing data previously written into the location; last data is continuously and periodically overwritten existing old data; during the procedure, a writing pointer to the buffer moves based on the preset rules, and points toe location of the buffer where the data is not overwritten during current data writing.

4. The method for accessing data acquired by a digital oscilloscope according to claim 1, wherein, in the step of storing the data into the buffer, the data is written into the buffer cycled; a write-in cycle period T of the buffer equals total buffer capacity divided by data writing speed into the buffer; a data-delay-time t for a data segment existing in the buffer is started from the moment that the data segment is written in, and ended at the moment that the data segment is read out; a depth of the buffer ensures T to be greater than t, namely the write-in cycle period of the buffer is greater than the data-delay-time of the data segment corresponding to the trigger event.

5. The method for accessing data acquired by a digital oscilloscope according to claim 1, wherein, arranging a plurality of trigger events together to form a trigger-event-list; reading the data segment corresponding to each trigger event from the buffer and displaying simultaneously with acquiring data; or in the operating mode of acquisition is stopped, reading data segment corresponding to each trigger event in the trigger-event-list from the buffer and displaying.

6. The method for accessing data acquired by a digital oscilloscope according to claim 5, wherein, in the case that the data acquisition is stopped and the trigger conditions are changed, scanning the data in the buffer based on new trigger conditions after changed and generating new trigger events and forming a new trigger-event-list; reading corresponding data segments based on new trigger events in the new trigger-event-list and displaying corresponding waveforms.

7. The method for accessing data acquired by a digital oscilloscope according to claim 1, wherein, one of the preset rules is that data writing pointer starts from one end of the buffer, and points to next storage location by plus one or minus one after every data wrote.

8. A device to achieve the method for accessing data acquired by a digital oscilloscope according to claim 1, contains:
a data acquiring module, used to sample signals based on a preset sampling frequency and convert the signals into binary data by an ADC, and continuously store the data into a buffer based on preset rules;
a trigger event generating module, used to work with the data acquiring module and generate one trigger event based on preset timebase parameters and trigger conditions each time when acquired data meets the trigger conditions; and
a data read-out module, used to read one data segment from the buffer corresponding to every trigger event, and form a waveform and then display based on the data segment;
wherein the procedure of storing the acquired data into the buffer is independent of the procedure of generating the trigger event or reading the data segment or displaying the waveform; the data acquiring module is always periodically configured to convert the signals into the binary data by the ADC, and continuously store the data into the buffer based on the preset rules unless it is stopped or the data acquire is restarted; and the preset sampling frequency is not restricted by the timebase and can keep the same in full scale of the timebase.

9. The device according to claim 8, wherein, the trigger event contains address information or time stamp information of the data segment, so that the data read-out module is able to locate the location of the data segment corresponding to the trigger event; the trigger event generating, module contains a trigger-event-list forming module which is used to arrange a plurality of trigger events together to form a trigger-event-list; the data read-out module is used to read the data segment from the buffer corresponding to each trigger event and form the waveform and display; or in the, operating mode of acquisition stopped, the data read-out module is used to read the data segment from the buffer corresponding to each trigger event and display.

10. The device according to claim 9, wherein the trigger-event-list is only configured to record a location of a trigger point of each trigger event, and the data read-out module is configured to calculate a beginning location and an ending location of the data segment corresponding to the trigger event based on the time delay of the trigger point and the timebase setting to accurately obtain the data segment.

11. The device according to claim 8, wherein the trigger event generating module comprises an address counter synchronized with a buffer address, when the acquired data meets the trigger conditions, the address counter can be read to get the buffer address of the trigger event data, and a beginning address and an ending address of the data segment corresponding to the trigger event is calculated according to trigger delays and timebase settings.

12. The device according to claim 11, wherein the beginning address and the ending address of the data segment corresponding to the trigger event can be calculated by the trigger event generating module and placed in the trigger-event-list, or, the beginning address and the ending address can be calculated by the data read-out module, and the trigger event may only include the address information of the trigger point.

13. The device according to claim 8, wherein the buffer is a single-port storage so that a port is time-shard by a write-in and read-out procedure.

14. A digital oscilloscope for converting an analog signal into a digital data and displaying the digital data, and storing, accessing and displaying the data to implement:
sampling signals based on a preset sampling frequency and converting the signals into binary data by an ADC, and continuously storing the data into a buffer based on preset rules;
generating one trigger event based on preset timebase parameters and trigger conditions each time when acquired data meets the trigger conditions: and
reading a data segment from the buffer corresponding to each trigger event, and forming a waveform and then displaying;
wherein the procedure of storing the acquired data into the buffer is independent of the procedure of generating the trigger event or reading the data segment or displaying the waveform; the step of converting the signals into the binary data by the ADC, and continuously storing the data into the buffer can be always periodically executed based on the preset rules unless it is stopped or the data acquire is restarted; and the preset sampling frequency is not restricted by the timebase and can keep the same in full scale of the timebase.

15. The digital oscilloscope for converting an analog signal into a digital data and displaying the digital data according to claim 14, wherein, when reading the data segment, address information of the data segment in the buffer corresponding to the trigger event is directly obtained or obtained after calculation, by using the address information or time stamp information in the trigger event, so that the data segment corresponding to the trigger event is accurately read from the buffer.

16. The digital oscilloscope for converting an analog signal into a digital data and displaying the digital data according to claim 14, wherein, during the procedure of acquiring data, continuously writing last acquired data into the buffer based on the preset rules with simultaneously reading the data segment and displaying; the read-out data is that written into a location during current data coverage; the buffer is reusable, and when the last location of the buffer is written into, returning to a first location of the buffer; last data is written into the buffer to overwrite existing data previously written into the location; last data is continuously and periodically overwritten existing old data; during the procedure, a writing pointer to the buffer moves based on the preset rules, and points toe location of the buffer where the data is not overwritten during current data writing.

17. The digital oscilloscope for converting an analog signal into a digital data and displaying the digital data according to claim 14, wherein, in the step of storing the data into the buffer, the data is written into the buffer cycled; a write-in cycle period T of the buffer equals total buffer capacity divided by data writing speed into the buffer; a data-delay-time t for a data segment existing in the buffer is started from the moment that the data segment is written in, and ended at the moment that the data segment is read out; a depth of the buffer ensures T to be greater than t, namely the write-in cycle period of the buffer is greater than the data-delay-time of the data segment corresponding to the trigger event.

18. The digital oscilloscope for converting an analog signal into a digital data and displaying the digital data according to claim 14, wherein, arranging a plurality of trigger events together to form a trigger-event-list reading the data segment corresponding to each trigger event from the buffer and displaying simultaneously with acquiring data; or in the operating mode of acquisition is stopped, reading data segment corresponding to each trigger event in the trigger-event-list from the buffer and displaying.

19. The digital oscilloscope for converting an analog signal into a digital data and displaying the digital data according to claim 18, wherein, in the case that the data acquisition is stopped and the trigger conditions are changed, scanning the data in the buffer based on new trigger conditions after changed and generating new trigger events and forming a new trigger-event-list reading corresponding data segments based on new trigger events in the new trigger-event-list and displaying corresponding waveforms.

20. The digital oscilloscope for converting an analog signal into a digital data and displaying the digital data according to claim 14, wherein, one of the preset rules is that data writing pointer starts from one end of the buffer, and points to next storage location by plus one or minus one after every data wrote.

* * * * *